United States Patent [19]
Verber et al.

[11] 4,364,633
[45] Dec. 21, 1982

[54] PAIRWISE COMPARISON DEVICE

[75] Inventors: Carl M. Verber; Richard P. Kenan, both of Columbus, Ohio

[73] Assignee: Battelle Memorial Institute, Columbus, Ohio

[21] Appl. No.: 130,329

[22] Filed: Mar. 14, 1980

[51] Int. Cl.³ .............................................. G02B 5/172
[52] U.S. Cl. .................................................. 350/96.14
[58] Field of Search ..................................... 350/96.14

[56] References Cited

U.S. PATENT DOCUMENTS

| | | | |
|---|---|---|---|
| 3,909,108 | 9/1975 | Taylor | 350/96.14 |
| 4,070,092 | 1/1978 | Burns | 350/96.14 |
| 4,128,300 | 12/1978 | Stotts et al. | 350/96.14 |
| 4,196,964 | 4/1980 | Papuchon | 350/96.14 |

Primary Examiner—John D. Lee
Attorney, Agent, or Firm—Philip M. Dunson

[57] ABSTRACT

Apparatus for comparing first and second sets of voltages having one-to-one correspondence, and providing an indication responsive to the magnitudes of the pairwise differences of the voltages; typically comprising a plurality of channel waveguides (11), each having a first electrode (12) on one side of the channel (11) and a second electrode (13) on the opposite side of the channel (11); contacts (14) and conductors (16) for connecting each voltage of the first set to the first electrode (12) of one waveguide (11); contacts (b 15) and conductors (17) for connecting each voltage of the second set to the second electrode (13) of the waveguide (11) to the first electrode (12) of which the corresponding voltage of the first set is connected; a coupling prism (18), a beam splitter (19), and a waveguide portion (20) for directing to the input end (21,22) of each waveguide (11) a substantially plane wave of coherent light (as indicated at 23,24,25) having predetermined relative intensity and phase; and a detector (51) and associated circuitry (52,58) responsive to the light emerging (as indicated at 26) from the output end (28,29) of the waveguides (11) (via a beam splitter 44 and a coupling prism 45) for providing an indication that is a function of the pairwise relative magnitudes of the first set of voltages and the second set of voltages.

19 Claims, 5 Drawing Figures

FIG. 1

PAIRWISE COMPARISON DEVICE

The invention described herein was made in the performance to work under NASA Contract No. NAS 1-14655 and is subject to the provisions of Section 305 of the National Aeronautics and Space Act of 1958 (72 Stat. 435; 42 U.S.C. 2457).

FIELD

This invention relates to apparatus for pairwise comparison of quantities such as numbers, components of vectors, physical properties, and any other computable or measurable quantities. Each quantity is converted into a voltage, and two sets of voltages having one-to-one correspondence (for each voltage in the first set there exists exactly one corresponding voltage in the second set, and for each voltage in the second set there exists exactly one corresponding voltage in the first set) are connected to the apparatus. The apparatus provides an indication that is a function of the relative magnitudes of each pair of corresponding voltages in the two sets (the algebraic difference between the first voltage of the first set and the first voltage of the second set, and so on for the second voltage in each set, the third voltage in each set, etc., to the last voltage in each set). The indication provided by the apparatus can be such as to be useful in computations such as vector or scalar subtraction (or addition, with the voltages in one set reversed), computing the proximities of sets of quantities, comparing such proximities, indicating whether sets are approximately identical, and various other information generating and processing operations.

BACKGROUND

A major problem associated with the earth resources monitoring programs is the enormous amount of data that is collected by the monitoring instruments and transmitted to earth from the remote sensor platforms. The quantity of the data is such that its timely analysis is a severe problem, a problem that will be compounded as more sophisticated, higher resolution sensors are employed. If we consider systems having as their purpose feature identification by means of the intensity or ratio of intensities of reflected solar radiation in a number of wavelength bands, then there are a number of approaches to cutting down the data load which might be considered. One obvious approach is to halt data transmission if it is determined that data are uninteresting. Thus, a device that recognizes the presence of excessive cloud cover can signal a halt to data transmission. Similarly, a device that recognizes clear sea water can be used to interrupt data transmission if only departures from clear water are sought.

A more sophisticated function than the editing function described above is that of remote feature identification in real time. If this is accomplished then feature identification rather than raw multispectral data can be transmitted, and an enormous reduction is achieved in the time between data acquisition and utilization.

A typical embodiment of the present invention comprises an integrated optical data preprocessor for multispectral data. The device compares received analog signals in 16 channels with a large set of prerecorded data sets in real time, and classifies the received data on the basis of the comparison. The operating principles of the device are discussed herein, and details of the prototype design are provided along with a discussion of the reasons for the design choices that were made. The prototype is a 16-channel integrated optical data processor utilizing optical subtraction techniques to take a "vector difference" of two sets of analog voltages. It includes a set of 16 signal electrodes and a set of 16 reference electrodes as well as electrodes for trimming the phase of the reference beam.

DISCLOSURE

Typical apparatus according to the present invention for comparing first and second sets of voltages having one-to-one correspondence, and providing an indication responsive to a function of the magnitudes of the pairwise differences of the voltages comprises: a plurality of channel waveguides, each having a first electrode on one side of the channel and a second electrode on the opposite side of the channel; means for connecting each voltage of the first set to the first electrode of one waveguide; means for connecting each voltage of the second set to the second electrode of the waveguide to the first electrode of which the corresponding voltage of the first set is connected; means for directing to the input end of each waveguide a substantially plane wave of coherent light having predetermined relative intensity and phase; and means responsive to the light emerging from the output end of the waveguides for providing an indication that is a function of the pairwise relative magnitudes of the first set of voltages and the second set of voltages.

The channel waveguides and the adjacent means typically comprise a device for guiding a relatively broad substantially plane input wave of coherent light, segmenting it into a plurality of narrower waves, and reassembling them into a single relatively broad input wave that may be similar to the input wave or may have a phase shift pattern imposed upon it. Typically this device comprises a thin film waveguide whose width is relatively broad at its input end, positioned to receive the input wave, and comprising: a relatively short input end portion comprising a continuous region of thin material, having a relatively high index of refraction and of substantially uniform width, extending in a predetermined direction; a first longer transitional portion comprising a continuation of the same material extending from the input end portion in approximately the same direction in a plurality of narrower first transitional strips of which adjacent ones are contiguous at the input end, each strip tapering away from the adjacent strips approximately as a long, narrow parabola to a substantially narrower width at its other end; a middle portion comprising a further continuation of the same material extending from the narrower ends of the first transitional strips in approximately the same direction, at least for a substantial length, in still longer middle strips of substantially uniform width and spacing; a second transitional portion, similar to the first, comprising a further continuation of the same material extending from the middle strips in approximately the same direction in second transitional strips, each tapering from the narrow width of the middle strips approximately as a long, narrow parabola to the width where it becomes contiguous to the adjacent strips; and a relatively short output end portion, similar to the input end portion, comprising a further continuation of the same material in a continuous region extending from the second transitional portion in approximately the same direction. Typically the middle strips are parallel to each other and are curved in a region spaced from the transitional portions, and the width of each middle strip is about 2 to 50 times the wavelength of the input wave.

The apparatus typically comprises first and second such waveguides located substantially in a plane; wherein the input end portion of the first waveguide extends in a direction at an acute angle with a straight centerline in the plane, to direct the input wave generally along, but also away from, the centerline; the middle portion of the waveguide is curved in a region spaced from the transition portions, to direct the wave further at an approximately equal acute angle, generally along, but also back toward, the centerline; and the second waveguide is similar to the first one, except that it is a mirror image thereof and symmetrically positioned therewith on the opposite side of the centerline.

Typically the apparatus comprises also an input-end thin film surface grating means for receiving a substantially plane wave of coherent light and splitting it into first and second input beams; the first input beam, comprising a part, (a), of the received wave, being directed in a first direction to the input end portion of the first waveguide, and the second input beam, comprising substantially the remainder, (1−a), of the received wave, being directed in a second direction to the input end portion of the second waveguide; and an output-end thin film surface grating means for receiving the beam from the output end portion of the first waveguide and splitting in into first and second output component beams; the first output component beam, comprising a part, (1−a), of the beam received from the first waveguide, being directed in a third direction to detecting means for providing an indication responsive to the intensity of any light impinging upon it, and the second output component beam, comprising substantially the remainder, (a), of the beam received from the first waveguide, being directed in a fourth direction to regions spaced from the detecting means; the output thin film surface grating means receiving also the beam from the output end portion of the second waveguide and splitting it into third and fourth output component beams, the third output component beam, comprising a part, (a), of the beam received from the second waveguide, being directed in the third direction to the detecting means, and the fourth output component beam, comprising substantially the remainder, (1−a), of the beam received from the second waveguide, being directed in the fourth direction to regions spaced from the detecting means; wherein any of the named directions may be substantially the same as any other except that the first direction must be different from the second and the third direction must be different from the fourth; whereby the light directed by the output thin film surface grating means to the detecting means comprises substantially the fraction (a) (1−a) of the wave received by the input thin film surface grating means, which may have had a phase shift pattern imposed upon it while passing through the first waveguide, combined with a substantially equal fraction of the same wave, which may have had a phase shift pattern imposed upon it while passing through the second waveguide.

The apparatus typically comprises also means for controlling the phase of the wave in each middle strip, and the phase controlling means typically comprises a first electrode on one side of each middle strip, a second electrode on the opposite side of each middle strip, and means for connecting a voltage to each electrode.

Where the apparatus is used for providing an indication of whether the sets are approximately identical, the means responsive to the emerging light may comprise means for providing an indication when the first set of voltages is within a selected close approximation to the second set of voltages.

The apparatus may be used for comparing a first set of voltages with each of a plurality of second sets of voltages. It then typically comprises means for connecting each second set to the corresponding second electrodes at a different instant while the first set is connected to the corresponding first electrodes, and the means responsive to the emerging light typically comprises means for determining how closely each second set approximates the first set. The means responsive to the emerging light may comprise also means for indicating which, if any, of the second sets of voltages are within a selected close approximation to the first set of voltages. Alternatively, or additionally, the means responsive to the emerging light may comprise also means for comparing the respective closenesses, and means for indicating which second set most closely approximates the first set.

Where the apparatus is used for providing an indication that is a function of the magnitude of the difference of two vectors, the vectors may be represented by analogs comprising a first set of voltages proportional to the respective components of one vector and a second set of voltages proportional to the respective components of the other vector. Similarly, where the apparatus is used for providing an indication that is a function of the algebraic sum of the pairwise algebraic differences between two sets of numbers having one-to-one correspondence, the numbers may be represented by analogs comprising a first set of voltages proportional to the respective numbers in one set and a second set of voltages proportional to the respective numbers in the other set.

In typical embodiments of the invention, the plurality of channel waveguides are located substantially in a plane and include, for each waveguide to the electrodes of which are connected a voltage of the first set and a voltage of the second set, a waveguide positioned on the opposite side of a straight line in the plane; means are provided for controlling the phase of the wave in each opposite-side waveguide such that at the output end thereof the phase is substantially a selected angle away from the phase of the wave at the output end of the corresponding waveguide on the other side of the line when the voltage of the first set and the voltage of the second set connected to the electrodes thereof are substantially equal; and the means responsive to the emerging light comprises means for effectively combining the wave at the output end of the corresponding waveguides with the wave at the output end of the opposite-side waveguides to provide a combined wave whose intensity is a function of the phase difference between the output waves, and means responsive to the combined wave for providing an indication that is a function of the intensity thereof. Typically the opposite-side waveguide is a mirror image of its corresponding waveguide and is symmetrically positioned on the opposite side of the straight line in the plane.

For many typical uses of the apparatus, including most of those mentioned above, the selected phase-difference angle is 180 degrees. For some other typical uses, such as the indication of the algebraic sum of pairwise algebraic differences as mentioned above, the selected phase-difference angle is 90 degrees.

CARRYING OUT THE INVENTION

Figure 1:
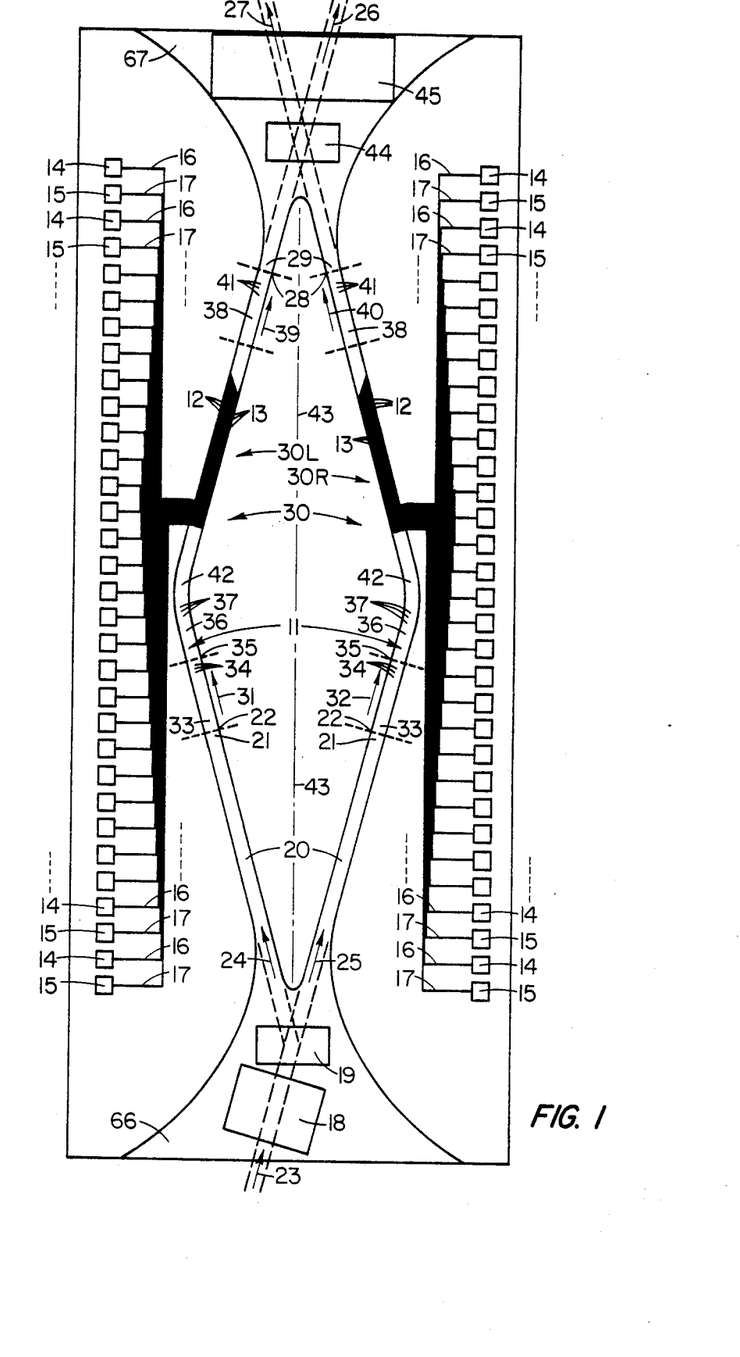
FIG. 1 is a plan view, greatly enlarged and partly schematic, of typical apparatus according to the present invention.
Figures 2, 4, 5:
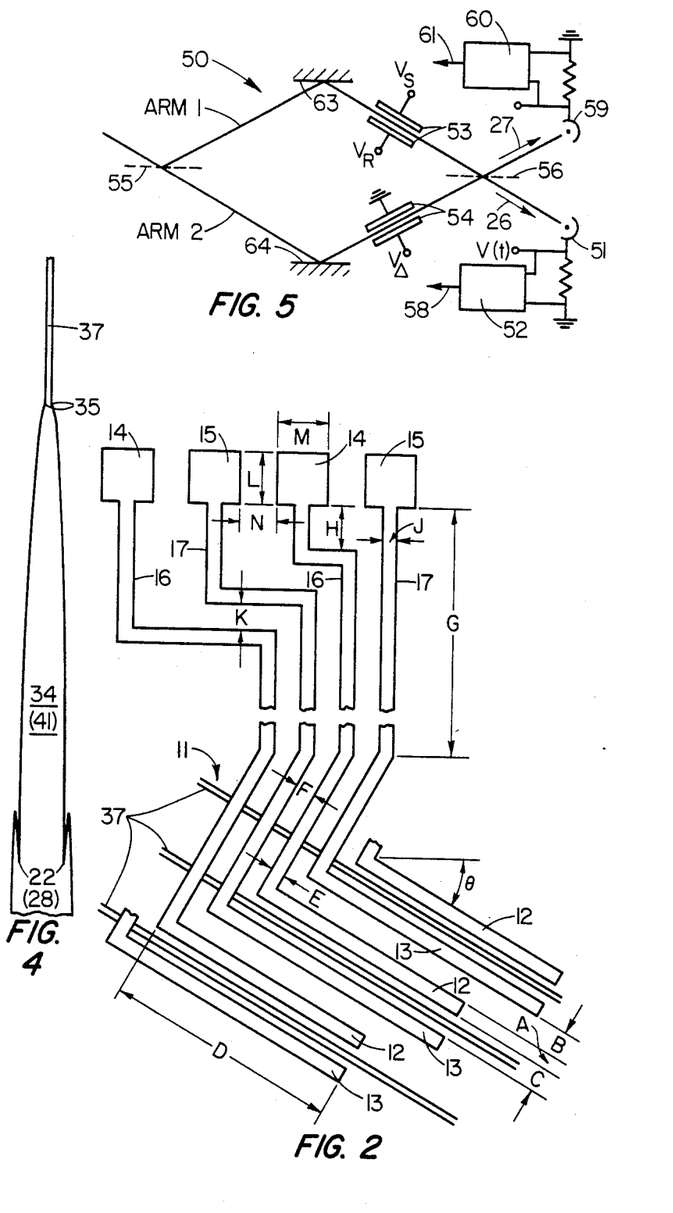
FIG. 2 is a still further enlarged plan view, not to scale, of a midportion of the voltage connecting means, which in FIG. 1 appears as solid black because the scale is not large enough for the spacing between the conductors to be visible.
FIG. 4 is a plan view, not to scale, expanded in width but contracted in length as compared with FIG. 3, showing the parabolic shape of a transitional strip 34 (or 41) in the transitional portion 33 (or 38) of FIG. 3.
FIG. 5 is schematic view of a simple Mach-Zehnder interferometer that is roughly equivalent in its principles of operation to those of a single channel in the apparatus of FIG. 1.

Referring to FIGS. 1 and 2, typical apparatus according to the present invention for comparing first and second sets of voltages having one-to-one correspondence, and providing an indication responsive to the magnitudes of the pairwise differences of the voltages, comprises a plurality of channel waveguides 11, each having a first electrode 12 on one side of the channel 11 and a second electrode 13 on the opposite side of the channel 11, means 14,16 for connecting each voltage of the first set to the first electrode 12 of one waveguide 11, means 15,17 for connecting each voltage of the second set to the second electrode 13 of the waveguide 11 to the first electrode 12 of which the corresponding voltage of the first set is connected, means 18,19,20 for directing to the input end 21,22 (see also FIG. 3) of each waveguide 11 a substantially plane wave of coherent light (as indicated at 23,24,25) having predetermined relative intensity and phase, and means (such as the detector 51) and associated circuitry 52,58, in FIG. 5) responsive to the light 26 emerging from the output end 28,29 of the waveguides 11 (via a beam splitter 44 and a coupling prism 45) for providing an indication that is a function of the pairwise relative magnitudes of the first set of voltages and the second set of voltages.

The channel waveguides 11 and the adjacent means 21,29 typically comprise a device for guiding a relatively broad substantially plane input wave 24 or 25 of coherent light, segmenting it into a plurality of narrower waves, and reassembling them into a single relatively broad output wave 26 or 27 that may be similar to the input wave 24 or 25 or may have a phase shift pattern imposed upon it. Typically this device comprises a thin film waveguide 30 whose width is relatively broad at its input end 21, positioned to receive the input wave 24 or 25; comprising a relatively short input end portion 21 comprising a continuous region 21 of thin material, having a relatively high index of refraction and of substantially uniform width, extending in a predetermined direction 31 or 32; a first longer transitional portion 33 comprising a continuation of the same material extending from the input end portion 21 in approximately the same direction in a plurality of narrower first transitional strips 34 (FIGS. 3 and 4) of which adjacent ones are contiguous at the input end 22, each strip 34 tapering away from the adjacent strips 34 approximately as a long, narrow parabola (as in FIG. 4) to a substantially narrower width at its other end 35; a middle portion 36 comprising a further continuation of the same material extending from the narrower ends 35 of the first transitional strips 34 in approximately the same direction 31, at least for a substantial length, in still longer middle strips 37 of substantially uniform width and spacing; a second transitional portion 38, similar to the first (33), comprising a further continuation of the same material extending from the middle strips 37 in approximately the same direction 39 or 40 in second transitional strips 41, each tapering from the narrow width of the middle strips 37 approximately as a long, narrow parabola to the width where it becomes contiguous to the adjacent strips 41; and a relatively short output end portion 29, similar to the input end portion 21, comprising a further continuation of the same material in a continuous region 29 extending from the second transitional portion 38 in approximately the same direction 39 or 40. Typically the middle strips 37 are parallel to each other (as in FIG. 3) and are curved in a region 42 spaced from the transitional portions 33 and 38, and the width of each middle strip 37 is about 2 to 50 times the wavelength of the input wave 24 or 25.

The apparatus typically comprises first and second such waveguides 30 located substantially in a plane (the plane of the paper in FIG. 1), wherein the input end portion 21 of the first waveguide 30L extends in a direction 31 at an acute angle with a straight centerline 43 in the plane, to direct the input wave generally along, but also away from, the centerline 43, the middle portion 36 of the waveguide is curved in a region 42 spaced from the transition portions 33 and 38, to direct the wave further (in the direction 39) at an approximately equal acute angle, generally along, but also back toward, the centerline 43; and the second waveguide 30R is similar to the first one 30L, except that it is a mirror image thereof and symmetrically positioned (32,40) therewith on the opposite side of the centerline 43.

Typically the apparatus comprises also an input-end thin film surface grating means 19 for receiving a substantially plane wave of coherent light 23 (via a coupling prism 18) and splitting it into first and second input beams 24,25; the first input beam 24, comprising a part, (a), of the received wave 23, being directed, via a waveguide portion 20, in a first direction 31 to the input end portion 21 of the first waveguide 30L, and the second input beam 25, comprising substantially the remainder, (1−a), of the received wave 23, being directed in a second direction 32 to the input end portion 21 of the second waveguide 30R; and an output-end thin film surface grating means 44 for receiving the beam from the output end portion 29 of the first waveguide 30L and splitting it into first and second output component beams; the first output component beam, comprising a part, (1−a), of the beam received from the first waveguide 30L, being directed in a third direction 39 (via a coupling prism 45, as is indicated at 26) to detecting means 51 (FIG. 5) for providing an indication responsive to the intentsity of any light impinging upon it, and the second output component beam, comprising substantially the remainder, (a), of the beam received from the first waveguide 30L, being directed in a fourth direction 40 (via the coupling prism 45, as is indicated at 27) to regions spaced from the detecting means 51 (but such regions may have other detecting means 59, as in FIG. 5, for calibration or other purposes); the output thin film surface grating means 44 receiving also the beam from the output end portion 29 of the second waveguide 30R and splitting it into third and fourth output component beams, the third output component beam, comprising a part, (a), of the beam received from the second waveguide, being directed in the third direction 39 (via the coupling prism 45, as is indicated at 26) to the detecting means 51, and the fourth output component beam, comprising substantially the remainder, (1−a), of the beam received from the second waveguide 30R, being directed in the fourth direction 40 (via the coupling prism 45, as is indicated at 27) to regions spaced from the detecting means 51 (but optionally having other detecting means 59, and associated electronic circuitry 60,61, if desired); wherein any of the named directions may be substantially the same as any other except that the first direction 31 must be different from the second direction 32 and the third direction 39 must be different from the fourth direction 40; whereby the light 26 directed by the output thin film surface grating means to the detecting means 51 comprises substantially the fraction (a) (1−a) of the wave received by the input thin film surface grating means 19, which may have had a phase shift pattern imposed upon it while passing through the first waveguide 30L, combined with a substantially equal fraction of the same wave, which may have had a phase shift pattern imposed upon it while passing through the second waveguide 30R.

The apparatus typically comprises also means 14,16,12; 15,17,13 for controlling the phase of the wave in each middle strip, and the phase controlling means typically comprises a first electrode 12 on one side of each middle strip 37, a second electrode 13 on the opposite side of each middle strip 37, and means 14,16 and 15,17, respectively for connecting a voltage to each electrode 12 and 13.

Where the apparatus is used for providing an indication of whether the sets are approximately identical, the means responsive to the emerging light comprises means (such as the detector 51 and associated circuitry 52,58 in FIG. 5) for providing an indication when the first set of voltages is within a selected close approximation to the second set of voltages.

The apparatus may be used for comparing a first set of voltages with each of a plurality of second sets of voltages; and it then typically comprises means for connecting each second set to the corresponding second electrodes 13 at a different instant while the first set is connected to the corresponding first electrodes 12; and the means responsive to the emerging light comprises means (such as the detector 51 and associated circuitry 52,58 in FIG. 5) for determining how closely each second set approximates the first set. The means 51,52,58 responsive to the emerging light 26 may comprise also means for indicating which, if any, of the second sets of voltages are within a selected close approximation to the first set of voltages. Alternatively, or additionally, the means 51,52,58 responsive to the emerging light 26 may comprise also means for comparing the respective closenesses, and means for indicating which second set most closely approximates the first set.

Where the apparatus is used for providing an indication that is a function of the magnitude of the difference of two vectors, the vectors may be represented by analogs comprising a first set of voltages proportional to the respective components of one vector and a second set of voltages proportional to the respective components of the other vector. Similarly, where the apparatus is used for providing an indication that is a function of the algebraic sum of the pairwise algebraic differences between two sets of numbers having one-to-one correspondence, the numbers may be represented by analogs comprising a first set of voltages proportional to the respective numbers in one set and a second set of voltages proportional to the respective numbers in the other set.

In typical embodiments of the invention, the plurality of channel waveguides 11(30) are located substantially in a plane (the plane of the paper in FIG. 1) and include, for each waveguide 11(30L) to the electrodes 12,13 of which are connected a voltage of the first set and a voltage of the second set, a waveguide 11(30R) positioned on the opposite side of a straight line 43 in the plane; means 14,16,12;15,17,13 are provided for controlling the phase of the wave in each opposite-side waveguide 11(30R) such that at the output end 29 thereof the phase is substantially a selected angle away from the phase of the wave at the output end of the corresponding waveguide 11(30L) on the other side of the line 43 when the voltage of the first set and the voltage of the second set connected to the electrodes 12,13 thereof are substantially equal; and the means responsive to the emerging light comprises means 44 for effectively combining the wave at the output end 29 of the corresponding waveguides 11(30L) with the wave at the output end 29 of the opposite-side waveguides 11(30R) to provide a combined wave 26 whose intensity is a function of the phase difference between the output waves 29, and means 51,52,58 responsive to the combined wave 26 for providing an indication that is a function of the intensity thereof. Typically each opposite-side waveguide 11(30R) is a mirror image of its corresponding waveguide 11(30L) and is symmetrically positioned on the opposite side of the straight line 43 in the plane.

For many typical uses of the apparatus, including most of those mentioned above, the selected phase-difference angle is 180 degrees. For some other typical uses, such as the indication of the algebraic sum of pairwise algebraic difference as mentioned above, the selected phase-difference angle is 90 degrees.

(The following discussion of the design and fabrication of a typical embodiment of the invention commonly refers to the apparatus in somewhat specific terms, such as "preprocessor". Such terms are not used, or to be construed, in any limiting sense.)

A number of concepts involved in the design of the preprocessor are unique to this device and have therefore not been dealt with in the literature. Among these are the use of tapered waveguide structures to segment and recombine a guided wave, and the use of curved channel waveguides to effect a major change in the propagation direction of a guided wave.

In order for the preprocessor to exhibit a large dynamic range, it must be capable of producing a good null when the signal and reference sets are identical and there is a 180 degree phase shift between the signal and reference beams. The beams must undergo a transition from the 0.8 mm-wide Ti-infused channel to 16 narrow parallel channels and back to 0.8 mm-wide channel. In order to get a good null in a device using this configuration, it would be ideal if a uniform plane wave entering the structure emerged from it as a uniform plane wave. This condition can be obtained only if the tapers connecting the narrow channels to the 0.8 mm channel function to remove all diffraction effects. If this perfect condition does not obtain, an acceptable null can still be achieved if the channel structure introduces no spurious amplitude or phase variations across the wavefront and the reference and signal beams both exhibit the same small perturbations due to the fact that the horns are not ideal.

Because of its novelty and its importance to the processor design, a variety of experiments were undertaken to characterize the transition from a single wide waveguide to 16 narrow channels and back to a single wide waveguide. In the initial fabrication tests satisfactory channel definition was demonstrated as well as the ability to couple into all sixteen 10 μm-wide channels from the 0.8 mm-wide waveguide.

Figure 3:
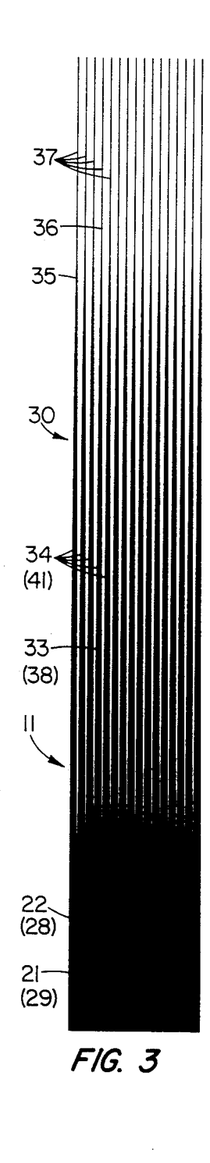
FIG. 3 is a plan view, at a scale between those of FIGS. 1 and 2, of the portions 21, 33, 29, and 38, (with the adjacent part of the portion 37) of the waveguides 30 in FIG. 1.

It is important that the channel waveguide structure be capable of reassembling a light beam into a close approximation of the wavefront incident upon the structure. The phase perturbations introduced by the horns and channels are examined interferometrically using sixteen 10 μm-wide channels joined by parabolic horns at either end as shown in FIG. 3. Satisfactory operation was observed as indicated by the fact that by shifting the phase of the reference beam the outputs of all channels could be extinguished simultaneously.

The design of the preprocessor has been driven by the interdependent goals of high performance and ease of fabrication. The latter goal led to the use of curved waveguides and has resulted in a device which, with the exception of the beam splitter 19 and combiner 44, can be fabricated in two photolithographic steps. The minimum feature size is 7 μm, although the relative positioning of the two patterns requires ±1 μm registration. These criteria are easily met in a well-equipped photolithographic facility. The main fabrication expense incurred in the production of the preprocessor is the one-time cost of the design and production of the photolithographic masks. As is indicated in FIG. 1, the entire optical path is defined by a symmetric titanium infused pattern on the surface of a single y-cut LiNbO$_3$ crystal. As indicated by a series of experiments performed earlier, a TM$_o$ guided wave seems to give the best results with such a waveguide. The optical path of the preprocessor is entirely symmetric for several reasons. The equality of the optical paths minimizes the coherence length requirements of the laser, thus allowing the use of a diode laser in the device. The symmetry also provides automatic compensation for any wavefront phase or amplitude perturbation introduced by the channel waveguide or electrode structures.

Another feature of the design that is indicated in FIG. 1 is the presence of a wide output coupling prism which allows both of the beams emerging from the beam combiner to be detected. Detecting and suitably combining both of the output intensities increases the device sensitivity as well as allows the suppression of noise due to laser power fluctuations.

The laboratory models of the preprocessor are fabricated upon a y-cut slab of LiNbO$_3$ with nominal dimensions of 2.5"×1"×0.040". The material used being "selected optical grade" LiNbO$_3$ from Crystal Technology, Inc.

Input coupling and output coupling are accomplished using rutile prisms. To simplify packaging and to reduce cost, the input prism has a base dimension of 5 mm×3.5 mm rather than the 10 mm×7 mm used in our earlier laboratory experiments. The output prism is 10 mm×3.5 mm to allow it to pass both output beams.

The entire optical path is a titanium-infused single-mode optical waveguide, used to guide the TM$_o$ mode. The titanium is deposited on the LiNbO$_3$ substrate by electron-beam evaporation and the waveguide pattern is defined by photolithographic techniques.

The major criterion for the selection of values of the channel waveguide parameters is the minimization of optical loss in the device. Our experiments indicate that the following values appear to be optimal.

| | |
|---|---|
| Channel width | 7 μm |
| Titanium thickness | 750Å |
| Infusion time | 5 hrs |
| Infusion temperature | 1000° C. |

Under these conditions waveguide losses of <2 dB/cm for the straight sections with an additional 10 dB/cm for the curved sections are typical. The overall optical loss typically is less than 16 dB, and the interchannel crosstalk less than 20 dB.

As can be seen in FIG. 1, the titanium infused pattern extends from one end of the substrate to the other and is symmetric about the long axis of the device. The symmetry is required by the optical considerations, but is also useful in that it minimizes the cost and difficulty of mask fabrication. The broad pads at either end of the device couple smoothly into the 0.8 mm-wide channels. The width of the pads enables the grating beam splitters to function properly. The smooth contour and broad expanse are chosen to facilitate the even flow of the photoresist which must be spun on in order to fabricate the gratings.

The broad pads are joined to the horn region by 0.8 mm-wide channels. The horns function to segment the beam into 16 parallel channels. The layout of the device is such as to provide the maximum straight channel length in the electrode region while minimizing the overall length of the narrow channels. This is done to minimize the required operating voltage and to localize, in so far as is possible, the regions which require high resolution lithography.

The horns couple smoothly into the 7 μm-wide channels, which then curve through a 20 degree arc with an average radius of curvature of 1 cm. After passing through the electrode region, the 16 individual beams are reassembled into a single wide beam by a second set of horn structures. The parabolic horns were designed using the results presented in the paper of W. K. Burns, A. F. Milton, and A. B. Lee, OPTICAL WAVEGUIDE PARABOLIC COUPLING HORNS, Appl. Phys. Letters 30, 28–30 (1977), for the case of well confined waveguide modes.

The channel waveguide width is chosen to be small enough to minimize curvature losses and large enough to minimize fabrication problems. A channel width of 7 μm is judged to be a suitable compromise. Aid in this aspect of the design of apparatus in accordance with this invention can be found in the paper LOSSES IN DIFFUSED LiNbO$_3$ WAVEGUIDES CAUSED BY DIRECTIONAL CHANGES, L. D. Hutcheson, Ian A. White, and James J. Burke, where experimental results for losses in single mode titanium diffused LiNbO$_3$ channel waveguides having corner bends and smooth curved bends are presented and compared to theory. This paper is included in TOPICAL MEETING ON INTEGRATED AND GUIDED-WAVE OPTICS, a digest of technical papers presented at the Topical Meeting on Integrated and Guided-Wave Optics, Jan. 28-30, 1980, Incline Village, Nev.; IEEE Catalog Number 80CH1489-4 QEA; Library of Congress Catalog Number 79-90228.

The beam splitter and the beam combiner are fabricated by the holographic exposure of photoresist using the 0.488 μm line of an argon-ion laser. Most of our work has been on beam splitters with a grating spacing of about 0.56 μm, which results in a 15 degree Bragg angle for the guided 0.6382 μm output of a He-Ne laser. These gratings have been produced with a diffraction efficiency η of 7%. The maximum throughput for the pair of gratings occurs when the two beams recombine in phase. In this case, the output intensity is diminished by a factor of $4\eta(1-\eta)$ from the input intensity. A pair of 7% gratings therefore have a transmission loss of 6 dB.

In a recent article *Holographic Recording Materials*, H. M. Smith, ed., R. A. Bartolini discusses the modulation transfer function of photoresist. He points out that the maximum useful recording spatial frequency of this material is 1500 lines/mm after which the response falls off sharply. The 15 degree gratings have a spatial frequency of 1800 lines/mm. We have found that even a slight increase in the grating spacing yields higher diffraction efficiencies. This is consistent with Bartolini's data. By going to a 10 degree Bragg angle the spatial frequency of the gratings is reduced to about 1200 lines/mm, typically with a diffraction efficiency of at least 15% and a grating loss of about 3 dB.

The use of channel guides in the data entry region of the processor allows the use of simple surface electrodes to impress electrical information on the light beam. The basic form and geometry of the electrodes used is shown in FIG. 2. Difference information is impressed on light in the waveguide channel passing between the electrodes by simply applying the signal voltage for that channel on one electrode and the reference voltage for that channel on the other electrode. Typical dimensions used in a presently preferred design are given in the following table.

| \multicolumn{3}{c}{ELECTRODE PARAMETERS FOR TYPICAL DESIGN} | | |
|---|---|---|
| Item | Meaning | Value |
| A | Width of an electrode | 15 μm |
| B | Space between adjacent electrode pairs | 10 μm |
| C | Space between electrodes of a pair | 10 μm |
| D | Length of an electrode | 7.75 mm |
| E | Width of leadout metallization | 20 μm |
| F | Space between leadout lines | 20 μm |
| G | Total fanout height | 4.1 mm |
| H | Offset between top horizontal fanout edge and lower pad edge | 1.0 mm |
| J | Width of fanout lines | 50 μm |
| K | Space between fanout lines | 50 μm |
| L | Pad height | 1.0 mm |
| M | Pad width | 1.0 mm |
| N | Space between pads | 0.5 mm |
| θ | Electrode rotation angle, relative to/padline | 10° |

One of the advantages of the use of curved channels rather than total internal reflection (TIR) mirrors or other direction changing means is that electrical connections to the electrodes can be made in-line on each edge of the $LiNbO_3$ crystal. To achieve a suitable in-line design without carrying thin lines of metallization over large distances required that we adopt the unsymmetric design shown in the lower part of FIG. 2, and that we use a more conventional fan-out scheme, as pictured in the upper part of FIG. 2. Typical dimensions for the fanout and pad regions are also given in the table.

The parameter H in FIG. 2 has been introduced to provide a controllable offset between the lower edge of the pad line and the upper edge of the horizontal part of the fanout lines. This offset is needed to facilitate making connections to the pads without danger of shorting the fanout lines through solder splash or other manufacturing artifacts.

Although it is desirable to use a semiconductor laser as the light source, it appeared to be more appropriate to use a He-Ne laser at the present stage of device development. However, except for the necessity of adjusting the grating spacing of the beam splitter and combiner, the device as described here is capable of operating at 0.82 μm.

The detector is chosen according to the criteria of sensitivity, noise figure, speed of response, convenience, and availability. The overall optical loss of the device is estimated to be a maximum of 23 dB. Therefore, 1 mw incident upon the input coupling prism results in 5 μw at the detector. This is more than enough light for a PIN photodiode such as the Hewlett Packard 5082-series devices. These have response speed in the nanosecond range, sensitivity of 0.5 μA/μw and noise equivalent powers in the range of $3\times10^{-14}$ watts. Output currents therefore are in the microamp range and the dynamic range is 80 dB, far greater than that of the device itself.

Package design presently is chosen to satisfy the following goals:

1. Provide protection for the integrated optical circuit (IOC) and interconnects.
2. Provide convenient electrical connections.
3. Provide for sturdy mounting of the coupling prisms.
4. Permit safe and convenient transporation.
5. Permit easy access to both input and output optics.

In order to minimize the cost, standard off-the-shelf components are chosen whenever possible. Size minimization is not considered important at this time. Several packages were considered including a dual inline integrated circuit package and one based on the thick film hybrid technology. Cost and availability led to a design that can be fabricated in-house with great flexibility and within a reasonable time frame.

The design focuses around a standard single-sided printed circuit (PC) board. The IOC and the PC board are mounted on a support plate in such a way that the waveguide surface is flush with the upper foil surface of the board. Above this structure is a metal frame used to clamp prisms on the IOC.

The main function of the printed circuit board is to provide electrical interconnect between the IOC and standard ribbon cable connectors. 1/16" glass epoxy board with gold plated leads was chosen. An etched pattern with pads for wire bonding forms the interconnect. Leads in this pattern fan out from the two long sides of the IOC to two connectors on opposite sides of the board respectively.

A standard ultrasonic wire-bonding technique is used to connect all 64 leads of the device. After the wire bonding is completed, prisms are added and clamped in position using fine thread nylon screws. A box cover can be added for protection during shipment and during testing in the laboratory.

The fabrication is accomplished by the following procedure:

1. Prepare waveguide mask.

2. Prepare electrode mask.

3. Prepare substrate for waveguide formation. This step includes inspection, cleaning, and if necessary, polishing of the substrate. It concludes with the deposition of a titanium film.

4. Photolithographically define waveguide pattern. This step includes the application of photoresist to the LiNbO$_3$ substrate, exposure and development of the resist and etching of the titanium pattern. It concludes with a careful microscopic evaluation of the titanium pattern; similar evaluations are made at the intermediate steps.

5. Thermally diffuse titanium to form waveguide pattern.

6. Aluminize the substrate.

7. Define electrode pattern. This step is similar to Step 4, but contains the additional element of registration of the electrode mask with the already existing waveguide pattern.

8. Form beam splitter and beam combiner. This is the third step which involves the application and exposure of photoresist. It differs from Steps 4 and 7 in that the pattern is defined by the interference of two coherent light beams and the resist which remains after development is the actual optical element. This is the only step in the fabrication procedure which involves something other than conventional photolithography.

9. Prepare printed circuit board. This step includes the design, board metallization, photolithographic definition, and etching of the fan-out pattern which will connect the electrodes to the ribbon cable connector.

10. Mount PC board on brass base.

11. Mount LiNbO$_3$ on support structure.

12. Bond leads. Conventional ultrasonic bonding is used.

13. Mount prisms.

The photolithographic processes of Steps 3, 4, 6, and 7 are based on the use of a positive photoresist with a positive mask and wet-chemical etching for metal pattern definition. Recent improvements in negative photoresists allow the use of a negative mask, if desired, in future work. Also, the lift-off technique may be preferred for one or the other of the photolithographic operations, using either positive or negative resists. By this method, the patterns are delineated in photoresist applied to the substrate surface after which metallization is performed. The unwanted metal is "lifted off" in final stripping of the resist.

The steps involved in fabricating the photolithography by masks are:

A. Define the patterns needed.

B. Generate the pattern by computer for final verification.

C. Generate a plotting tape or punched cards.

D. Generate a Rubylith pattern.

E. Generate intermediate.

F. Assemble intermediate into composite.

G. Fabricate mask sets.

One of the major differences between the requirements of integrated optics and integrated electronics, is that the former requires that close tolerances be maintained over large distances while the latter requires high component densities in small areas. We are therefore concerned about possible dimensional changes which might occur over the entire optical path due to thermal differences which might exist between the mask fabrication and mask exploursure sites. Assuming that the coefficient of thermal expansion of the mask substrate is close to that of clear fused quartz ($5.5 \times 10^{-7}$ cm/cm/°C.) we find that the dimensional change across the width of the pattern is less than 0.01 μm/°C. This is not a source of difficulty in the device fabrication.

Experiments in mask alignment and registration have shown that the waveguide pattern is visible even after it is covered with a layer of aluminum and a layer of photoresist. It is therefore possible to align the electrode mask by direct observation of the waveguide pattern. Nevertheless, we prefer to include standard registration marks on the masks. These are used for the initial alignment, the final alignment being by direct observation of the channel pattern.

APPLICABILITY

Typical operation of the invention as shown in FIGS. 1-4 can be best explained by looking first at the operation of the simple Mach-Zehnder interfermeter 50 shown in FIG. 5. The light intensity seen by the detector 51 is $$I = A_1^2 + A_2^2 + 2A_1A_2 \cos(\phi_1 - \phi_2) \quad (1)$$

where $A_1$ and $A_2$ are the amplitudes of the respective beams at the detector and $\phi_1$ and $\phi_2$ are their phases. In arm 1 and arm 2, an electrooptic medium is assumed, an electrooptic phase shifter 53 is shown in arm 1; another, 54, in arm 2. The phase shift in arm 1 is proportional to $V_S - V_R$ and will be set equal to $K(V_S - V_R)$. The phase shift in arm 2 is controlled by $V_\Delta$ and will be denoted by $\Delta$. If we set $A_1 = A_2 = A$, Eq. (1) can be rewritten $$I = 2A^2[1 + \cos(kV_S - kV_R - \Delta)] \quad (2)$$

Setting $A_1 = A_2$ will simplify the subsequent description of the operation. It is accomplished in a real device by using using a beam splitter 55 and beam combiner 56, which have identical properties.

The present invention is an integrated optical circuit (IOC) which incorporates a number of Mach-Zehnder interferometers in such a way that input voltages and output signals are read out in parallel. If we suppress diffraction effects by working in the near field, and have negligible cross-talk, then the IOC can be considered to be a simple interferometer in which the wavefront in each arm 30L,30R is broken up into N independent segments 37 each one of which can be subjected to a discrete phase shift. For an N-channel device Equation (1) becomes $$I = 2A^2 \sum_{i=1}^{N} [1 + \cos(\phi_{i1} - \phi_{i2})] \quad (3)$$

In the most general view of the device $$\phi_{i1} - \phi_{i2} = \frac{2n^3 r}{\lambda} \left[ \frac{l_1}{d_1}(V_{i\alpha} - V_{i\beta}) - \frac{l_2}{d_2}(V_{i\gamma} - V_{i\delta}) \right] \quad (4)$$

where n is the mode index of the guided wave, r is the appropriate electrooptic coefficient, $l_1$ and $d_1$ the length and width of the electrode gaps in the signal and reference areas, and the subscripts $\alpha$, $\beta$, $\gamma$, $\delta$ refer to the four electrical ports.

The most general inputs to the device is four voltage sets $\{V_\alpha\}$, $\{V_\beta\}$ $\{V_\gamma\}$, and $\{V_\delta\}$, each corresponding to a vector in an N-dimensional space. We will initially consider the N-channel analog of the simple interferometer 50 shown in FIG. 5. In this case $$\{V_\alpha\} = \{V_S\}$$

$$\{V_\beta\} = \{V_R\}$$

$$\{V_\gamma\} = \Delta$$

$$\{V_\delta\} = 0,$$

and the light intensity at the detector 51 is described by the equation $$I = 2A^2 \sum_{i=1}^{N} [1 + \cos(k V_{Si} - kV_{Ri} - \Delta)] \quad (5)$$

Examination of Eq. (5) will reveal several modes of operation of the device.

I. Identification Mode A. If $\Delta = \pm \pi$ then the condition $I=0$ obtains only when $V_{Si}=V_{Ri}$ for all i. If a reference set $\{V_R\}$ is imposed upon the reference electrodes 15 then incoming signal sets, connected to the signal electrodes 14, can be compared to this reference set and those signal sets which are equal to the reference set within a given limit (i.e., $2k(V_{Si}-V_{Ri})^2 \leq L$) can be identified.

II. Identification Mode B. In a fashion similar to that of Identification Mode A, a single signal set $\{V_S\}$, can be compared to a large number of reference sets $\{V_R\}_j$, $j=1 \ldots M$. Using conventional electronic circuitry 52, the smallest value of $d_j^2$ resulting from the subtraction can be identified at an output 58 that may provide a digital printout, an analog signal, or any other convenient identifying response. In this manner, the signal can be identified as being most similar to one member of the set of reference sets. This mode of operation requires a library of reference sets which can rapidly be applied to the reference electrodes in sequence. An advantage of the invention is derived from the parallel application of these voltages and the speed at which the optical comparison is performed.

III. Vector Subtraction. Using standard trigonometric identities and expansions it can be shown that for $\Delta = \pm \pi$ and $|k(V_{Si}-V_{Ri})| < < 1$ for all $i=1 \ldots N$, equation (3) can be rewritten, $$I = A^2 \sum_{i=1}^{N} k^2 (V_{Si} - V_{Ri})^2 = d^2 \quad (6)$$

If we regard $\{V_{Si}\}$ and $\{V_{Ri}\}$ as vectors in N dimensional space, then d is the "distance" between, or the magnitude of the difference of, the two vectors. This illustrates the vector subtraction mode of the invention.

IV. Scalar Subtraction. Using the same type of trigonometric identities and expansions used to derive Eq. (4), we find that for $\Delta = \pi/2$ and $|k(V_{Si}-V_{Ri})| < < 1$, Eq. (3) reduces to $$I = 2A^2 \left[ \sum_{i=1}^{N} 1 - k(V_{Si} - V_{Ri}) \right] \quad (7)$$

If the output of the apparatus is defined to be the signal $$S = \frac{1}{k}\left[ N - \frac{I}{2A^2} \right] = \sum_{i=1}^{N} V_{Si} - \sum_{i=1}^{N} V_{Ri} \quad (8)$$

then we can determine the difference between the sums of the signal and reference voltages. Note that in this case the signal can be positive or negative. This is the most sensitive mode of operation since, as can be shown from Eq. (3) $\partial I/\partial (V_{Si}-V_{Ri})$ is a maximum when $\Delta = \pi/2$ and $V_{Si} \approx V_{Ri}$.

To summarize some of the highlights of the typical embodiment of the invention as shown in the drawings, and its fabrication:

The primary purpose of the apparatus is to perform the vector subtraction operation. The apparatus in FIG. 1 is fabricated entirely upon a single LiNbO$_3$ crystal 6.35 cm × 2.54 cm. The optical path is a photolithographically-defined Ti-infused waveguide 11. Several features of this design should be noted. The Ti-pattern is flared out at each end 66,67 to accommodate the coupling prisms 18,45. The width of the arms 30 starts at 800 μm and is subdivided into sixteen channels, each 50 μm wide, by parabolic horn structures 34. The horns reduce each channel to a width of 7 μm over their length (at 37) of about 4.3 mm. The mirrors 63,64 of the Mach-Zehnder shown in FIG. 5 are replaced by curved channel waveguide sections 42 of mean radius 10 mm. This simplifies the fabrication considerably, but causes a significant (but tolerable) loss of light through radiation. Following the curved-channel section 42 is a long, straight section 36 on either side of which 7.75 μm long electrodes 12,13 are placed, one pair for each channel 37. The 7-μm channels 37 are then expanded to 50 μm again by a second set of parabolic horns 41 and the 800 μm arm width is recovered at 28. In the flared region 67 the light is allowed to impinge on the beam combiner 44, identical to the beam splitter 19 at the input end 66. The placement of the electrodes 12,13 near the beam combiner 44 was chosen to avoid signal mixing in the waveguide bends 42. The beam combiner 44 is placed in the near field of the radiation from the two arms 30. It is noted that while the smoothly flared Ti-infused regions at the ends 66,67 may appear to function as horns, the flare is much too abrupt to be an effective horn, and the light is effectively simply radiated from the ends of the arms 30, where the flare begins.

The data-input electrodes 12,13 are placed on the two arms 30 of the device in a second photolithographic step. The placement of identical electrode sets on the left and right arms 30L,30R enables the use of low voltages to produce the desired phase shift in the right arm 30R and also enables the channel-by-channel adjustment of the fixed phase shift, $\Delta$, which may be necessary to compensate for small fabrication variations among the channels. The individual electrodes 12,13 are connected through a fan-out region 16,17 to 1-mm × 1-mm pads 14,15 along the left and right edges of the crystal. A detail drawing of the electrode region is shown in FIG. 2.

Once fabricated, the crystal is mounted in a mechanical jig that serves both to clamp the prisms 18,45 in position and to attach the device to a pc board for convenient electrical connections using standard pc edge connectors. Once the crystal is mounted, the electrode pads 14,15 on the crystal surface are connected to an array of connecting lines on the pc board.

The device design has several other features also. First, the design is completely symmetric about its centerline 43; so variations in path lengths due to temperature variations or overall stresses are minimized, because the same changes take place in each arm 30. The symmetry also allows use of diode lasers having short coherence lengths. Next, the design calls for a wider prism 45, at the output 67 than the prism 18 at the input 66, so that the output 26,27 from both arms can be monitored (at 51 and 59). This allows simple ratioing methods to be used which eliminate the effects of intensity variations from the source of input prisms. Finally, the opening angle of the arms, 10°, (at 20 and 29) allows the use of fairly coarse surface gratings ($\Lambda = 0.828$ μm for $\lambda_o = 0.6328$ μm) for the beam splitter 19 and the beam combiner 44. This period is well below the resolution roll-off for common photoresists. At this period, the photoresist grating itself has sufficient efficiency for operation of the device.

Much of the disclosure in this section on Applicability and in the section on Background is contained in a paper presented by the inventors at the Society of Photo-optical Instrumentation Engineers (SPIE) Los Angeles Technical Symposium in North Hollywood, Calif., Feb. 4-8, 1980. The paper is titled AN INTEGRATED OPTICAL CIRCUIT FOR PERFORMING VECTOR SUBTRACTION, and is published in the proceedings of the symposium. The closest items of prior art that the inventors are aware of are the references cited in that paper and those cited in a paper titled A PROPOSED SMART INTEGRATED-OPTICAL PREPROCESSOR USING HOLGRAPHIC SUBTRACTION presented at the SPIE Technical Symposium East 1979, Washington, D.C., Apr. 17-20, 1979, by C. M. Verber (one of the present inventors) and D. W. Vahey. This paper is published in the proceedings of the symposium.

The references cited in the two papers are:

1. Wood, Van E., Hartman, N. F., Verber, C. M., and Kenan, R. P., HOLOGRAPHIC FORMATION OF GRATINGS IN OPTICAL WAVEGUIDING LAYERS, J. Appl. Phys., 46 1214 (1975).

2. Verber, C. M., AN INTEGRATED OPTICAL PREPROCESSOR FOR MULTICHANNEL ANALOG DATA, Paper presented at AIAA/NASA Conference on SMART SENSORS, NASA, Langley Research Center, Hampton, Va., Nov. 14-16, 1978.

3. Vahey, D. W., SMART, REMOTE HOLOGRAPHIC PROCESSOR BASED ON THE MATERIALS CHARACTERISTICS OF $LiNbO_3$, Paper presented at AIAA/NASA Conference on SMART SENSORS, NASA, Langley Research Center, Hampton, Va., Nov. 14-16, 1978.

4. von der Linde, D. and Glass, A. M., PHOTOREFRACTIVE EFFECTS FOR REVERSIBLE HOLOGRAPHIC STORAGE OF INFORMATION, Appl. Phys., 8, 85-100 (1975).

5. Staebler, D. L., and Amodei, J. J., COUPLED-WAVE ANALYSIS OF HOLOGRAPHIC STORAGE IN $LiNbO_3$, J. Appl. Phys., 43 (3), 1042-1049 (1972).

6. Kim, D. M., Shah, R. R., Rabson, T. A., and Tittle, F. K., NONLINEAR DYNAMIC THEORY FOR PHOTOREFRACTIVE PHASE HOLOGRAM FORMATION, Appl. Phys. Lett., 28 (6), 338-340 (1976).

7. Glass, A. M., von der Linde, D., and Negran, T. J., HIGH VOLTAGE BULK PHOTOVOLTAIC EFFECT AND THE PHOTO-REFRACTIVE PROCESS IN $LiNbO_3$, Appl. Phys. Lett., 25 (4), 233-235 (1974).

8. Burns, W. K., Milton, A. F., and Lee, A. B., OPTICAL WAVEGUIDE PARABOLIC COUPLING HORNS, Appl. Phys. Lett., Vol. 30, pp 28-30 (1977).

9. Milton, A. F., and Burns, W. K., MODE COUPLING IN OPTICAL WAVEGUIDE HORNS, IEEE Jour. Quantum Elect., Vol. QE-13, pp 828-835 (1977).

10. Heiblum, M. and Harris, J. H., ANALYSIS OF CURVED OPTICAL WAVEGUIDES BY CONFORMAL TRANSFORMATION, IEEE Jour. Quantum Elect., Vol. QE-11, pp 75-83 (1979).

11. Verber, C. M., AN INTEGRATED OPTICAL PREPROCESSOR FOR MULTICHANNEL ANALOG DATA, Progress in Astronautics and Aeronautics, Volume 67, pp 367-379 (1979).

While the forms of the invention herein disclosed constitute presently preferred embodiments, many others are possible. It is not intended herein to mention all of the possible equivalent forms or ramifications of the invention. It is to be understood that the terms used herein are merely descriptive rather than limiting, and that various changes may be made without departing from the spirit or scope of the invention.

We claim:

1. Apparatus for comparing first and second sets of voltages having one-to-one correspondence, and providing an indication responsive to the magnitudes of the pairwise differences of the voltages; comprising a Mach-Zehnder interferometer, at least one arm of which includes a plurality of channel waveguides, each waveguide having a first electrode on one side of the channel and a second electrode on the opposite side of the channel;

means for connecting each voltage of the first set to the first electrode of one waveguide;

means for connecting each voltage of the second set to the second electrode of the waveguide to the first electrode of which the corresponding voltage of the first set is connected;

means for directing to the input end of each waveguide a substantially plane wave of coherent light having predetermined relative intensity and phase; and means responsive to the light emerging from the output end of the waveguides for providing an indication that is a function of the pairwise relative magnitudes of the first set of voltages and the second set of voltages.

2. Apparatus for comparing first and second sets of voltages having one-to-one correspondence, and providing an indication responsive to the magnitudes of the pairwise differences of the voltages; comprising a plurality of channel waveguides, each having a first electrode on one side of the channel and a second electrode on the opposite side of the channel;

means for connecting each voltage of the first set to the first electrode of one waveguide;

means for connecting each voltage of the second set to the second electrode of the waveguide to the first electrode of which the corresponding voltage of the first set is connected;

means for directing to the input end of each waveguide a substantially plane wave of coherent light having predetermined relative intensity and phase; and means responsive to the light emerging from the output end of the waveguides for providing an indication that is a function of the pairwise relative magnitudes of the first set of voltages and the second set of voltages, and wherein the channel waveguides, electrodes, voltage connecting means, and light directing means comprise a device for guiding the input wave of coherent light, segmenting it into a plurality of waves, and reassembling them into a single output wave that may be similar to the input wave or may have a phase shift pattern imposed upon it; comprising a thin film waveguide whose width is relatively broad at its input end, positioned to receive the input wave; comprising a relatively short input end portion comprising a continuous region of thin material, having a relatively high index of refraction and of substantially uniform width, extending in a predetermined direction;

a first longer transitional portion comprising a continuation of the same material extending from the input end portion in approximately the same direction in a plurality of narrower first transitional strips of which adjacent ones are contiguous at the input end, each strip tapering away from the adjacent strips approximately as a long, narrow parabola to a substantially narrower width at its other end;

a middle portion comprising a further continuation of the same material extending from the narrower ends of the first transitional strips in approximately the same direction, at least for a substantial length, in still longer middle strips of substantially uniform width and spacing;

a second transitional portion, similar to the first, comprising a further continuation of the same material extending from the middle strips in approximately the same direction in second transitional strips, each tapering from the narrow width of the middle strips approximately as a long narrow parabola to the width where it becomes contiguous to the adjacent strips; and a relatively short output end portion, similar to the input end portion, comprising a further continuation of the same material in a continuous region extending from the second transitional portion in approximately the same direction.

3. Apparatus as in claim 2, wherein the middle strips are parallel to each other and are curved in a region spaced from the transitional portions.

4. Apparatus as in claim 3, wherein the width of each middle strip is about 2 to 50 times the wavelength of the input wave.

5. Apparatus as in claim 2, 3, or 4, comprising first and second such waveguides located substantially in a plane; wherein the input end portion of the first waveguide extends in a direction at an acute angle with a straight centerline in the plane, to direct the input wave generally along, but also away from, the centerline;

the middle portion of the waveguide is curved in a region spaced from the transition portions, to direct the wave further at an approximately equal acute angle, generally along, but also back toward, the centerline; and the second waveguide is similar to the first one, except that it is a mirror image thereof and symmetrically positioned therewith on the opposite side of the centerline.

6. Apparatus as in claim 5; comprising also an input-end thin film surface grating means for receiving a substantially plane wave of coherent light and splitting it into first and second input beams;

the first input beam, comprising a part, (a), of the received wave, being directed in a first direction to the input end portion of the first waveguide, and the second input beam, comprising substantially the remainder, $(1-a)$, of the received wave, being directed in a second direction to the input end portion of the second waveguide; and an output-end thin film surface grating means for receiving the beam from the output end portion of the first waveguide and splitting it into first and second output component beams;

the first output component beam, comprising a part, $(1-a)$, of the beam received from the first waveguide, being directed in a third direction to detecting means for providing an indication responsive to the intensity of any light impinging upon it, and the second output component beam, comprising substantially the remainder, (a), of the beam received from the first waveguide, being directed in a fourth direction to regions spaced from the detecting means;

the output thin film surface grating means receiving also the beam from the output end portion of the second waveguide and splitting it into third and fourth output component beams, the third output component beam, comprising a part, (a), of the beam received from the second waveguide, being directed in the third direction to the detecting means, and the fourth output component beam, comprising substantially the remainder, $(1-a)$, of the beam received from the second waveguide, being directed in the fourth direction to regions spaced from the detecting means;

wherein any of the named directions may be substantially the same as any other except that the first direction must be different from the second and the third direction must be different from the fourth;

whereby the light directed by the output thin film surface grating means to the detecting means comprises substantially the fraction (a) $(1-a)$ of the wave received by the input thin film surface grating means, which may have had a phase shift pattern imposed upon it while passing through the first waveguide, combined with a substantially equal fraction of the same wave, which may have had a phase shift pattern imposed upon it while passing through the second waveguide.

7. Apparatus as in claim 6, comprising also means for controlling the phase of the wave in each middle strip.

8. Apparatus as in claim 7, wherein the phase controlling means comprises a first electrode on one side of each middle strip, a second electrode on the opposite side of each middle strip, and means for connecting a voltage to each electrode.

9. Apparatus as in claim 8, for providing an indication of whether the sets are approximately identical, wherein the means responsive to the emerging light comprises means for providing an indication when the first set of voltages is within a selected close approximation to the second set of voltages.

10. Apparatus as in claim 8, for comparing a first set of voltages with each of a plurality of second sets of voltages; comprising means for connecting each second set to the corresponding second electrodes at a different instant while the first set is connected to the corresponding first electrodes;

wherein the means responsive to the emerging light comprises means for determining how closely each second set approximates the first set.

11. Apparatus as in claim 10, wherein the means responsive to the emerging light comprises also means for indicating which, if any, of the second sets of voltages are within a selected close approximation to the first set of voltages.

12. Apparatus as in claim 10, wherein the means responsive to the emerging light comprises also means for comparing the respective closenesses, and means for indicating which second set most closely approximates the first set.

13. Apparatus as in claim 8, for providing an indication that is a function of the magnitude of the difference of two vectors, wherein the vectors are represented by analogs comprising a first set of voltages proportional to the respective components of one vector and a second set of voltages proportional to the respective components of the other vector.

14. Apparatus as in claim 8, for providing an indication that is a function of the algebraic sum of the pairwise algebraic differences between two sets of numbers having one-to-one correspondence, wherein the numbers are represented by analogs comprising a first set of voltages proportional to the respective numbers in one set and a second set of voltages proportional to the respective numbers in the other set.

15. Apparatus as in claim 8, wherein the plurality of channel waveguides are located substantially in a plane and include, for each waveguide to the electrodes of which are connected a voltage of the first set and a voltage of the second set, a waveguide positioned on the opposite side of a straight line in the plane;

means are provided for controlling the phase of the wave in each opposite-side waveguide such that at the output end thereof the phase is substantially a selected angle away from the phase of the wave at the output end of the corresponding waveguide on the other side of the line when the voltage of the first set and the voltage of the second set connected to the electrodes thereof are substantially equal; and the means responsive to the emerging light comprises means for effectively combining the wave at the output end of the corresponding waveguides with the wave at the output end of the opposite-side waveguides to provide a combined wave whose intensity is a function of the phase difference between the output waves, and means responsive to the combined wave for providing an indication that is a function of the intensity thereof.

16. Apparatus as in claim 15, wherein the opposite-side waveguide is a mirror image of its corresponding waveguide and is symmetrically positioned on the opposite side of the straight line in the plane.

17. Apparatus as in claim 16, wherein the selected angle is 180 degrees.

18. Apparatus as in claim 16, wherein the selected angle is 90 degrees.

19. Apparatus for guiding a substantially plane input wave of coherent light, segmenting it into a plurality of waves, and reassembling them into a single output wave, comprising a thin film waveguide whose width is relatively broad at its input end, positioned to receive the input wave; comprising a relatively short input end portion comprising a continuous region of thin material, having a relatively high index of refraction and of substantially uniform width, extending in a predetermined direction;

a first longer transitional portion comprising a continuation of the same material extending from the input end portion in approximately the same direction in a plurality of narrower first transitional strips of which adjacent ones are contiguous at the input end, each strip tapering away from the adjacent strips approximately as a long, narrow parabola to a substantially narrower width at its other end;

a middle portion comprising a further continuation of the same material extending from the narrower ends of the first transitional strips in approximately the same direction, at least for a substantial length, in still longer middle strips of substantially uniform width and spacing;

a second transitional portion, similar to the first, comprising a further continuation of the same material extending from the middle strips in approximately the same direction in second transitional strips, each tapering from the narrow width of the middle strips approximately as a long, narrow parabola to the width where it becomes contiguous to the adjacent strips; and a relatively short output end portion, similar to the input end portion, comprising a further continuation of the same material in a continuous region extending from the second transitional portion in approximately the same direction.

* * * * *